(12) United States Patent
Gallo et al.

(10) Patent No.: US 10,277,962 B2
(45) Date of Patent: Apr. 30, 2019

(54) SENSOR BASED DETECTION SYSTEM

(71) Applicants: ALLIED TELESIS HOLDINGS K.K., Tokyo (JP); ALLIED TELESIS, INC., Bothell, WA (US)

(72) Inventors: Joseph L. Gallo, Santa Cruz, CA (US); Ferdinand E. K. de Antoni, Taguig City (PH); Scott Gill, Makati (PH); Daniel Stellick, Chicago, IL (US)

(73) Assignee: ALLIED TELESIS HOLDINGS KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/312,617

(22) PCT Filed: May 19, 2015

(86) PCT No.: PCT/US2015/031632
§ 371 (c)(1),
(2) Date: Nov. 18, 2016

(87) PCT Pub. No.: WO2015/179442
PCT Pub. Date: Nov. 26, 2015

(65) Prior Publication Data
US 2017/0111714 A1 Apr. 20, 2017

Related U.S. Application Data

(63) Continuation of application No. 14/281,896, filed on May 20, 2014, and a continuation of application No.
(Continued)

(51) Int. Cl.
*G08C 19/16* (2006.01)
*H04Q 9/00* (2006.01)
(Continued)

(52) U.S. Cl.
CPC ............... *H04Q 9/00* (2013.01); *G01T 1/247* (2013.01); *G06F 17/30516* (2013.01); *G06F 3/04842* (2013.01); *G08B 21/12* (2013.01)

(58) Field of Classification Search
CPC ..... H04Q 9/00; G01T 1/247; G06F 17/30516; G06F 3/04842; G08B 21/12
(Continued)

(56) References Cited

U.S. PATENT DOCUMENTS 4,970,391 A   11/1990 Uber
5,978,737 A   11/1999 Pawlowski et al.
(Continued)

FOREIGN PATENT DOCUMENTS

JP        2007085755 A    4/2007
KR   1020070028813 A    3/2007
(Continued)

OTHER PUBLICATIONS

Aberer, Karl, Hauswirth, Manfred, Salehi, Ali, "Infrastructure for data processing in large-scale interconnected sensor networks", 2007, IEEE pp. 198-205.
(Continued)

*Primary Examiner* — Tanmay Shah
(74) *Attorney, Agent, or Firm* — Brooks Acordia IP Law, PC; Michael Zarrabian

(57) ABSTRACT

Systems, apparatuses, and methods described herein are configured for monitoring and managing a plurality of sensors. The plurality of sensors may be fixed, mobile, or a combination thereof. In some embodiments, the monitoring and management of the sensors is facilitated via a graphical user interface.

22 Claims, 7 Drawing Sheets

Related U.S. Application Data

14/281,901, filed on May 20, 2014, now Pat. No. 9,779,183, and a continuation of application No. 14/281,904, filed on May 20, 2014.

(51) Int. Cl.
*G01T 1/24* (2006.01)
*G06F 17/30* (2006.01)
*G08B 21/12* (2006.01)
*G06F 3/0484* (2013.01)

(58) Field of Classification Search
USPC .................................................. 340/870.01
See application file for complete search history.

(56) References Cited

U.S. PATENT DOCUMENTS

| | | | |
|---|---|---|---|
| 6,047,244 | A | 4/2000 | Rud |
| 6,642,843 | B2 | 11/2003 | Satoh |
| 6,686,838 | B1 | 2/2004 | Rezvani et al. |
| 6,833,814 | B2 | 12/2004 | Gilboa et al. |
| 7,030,752 | B2 | 4/2006 | Tyroler |
| 7,091,854 | B1 | 8/2006 | Miao |
| 7,555,412 | B2 | 6/2009 | Nath et al. |
| 8,575,560 | B1 | 11/2013 | Fechner |
| 8,732,592 | B2 | 5/2014 | Nielsen et al. |
| 2003/0058095 | A1 | 3/2003 | Satoh |
| 2003/0107650 | A1 | 6/2003 | Colmenarez et al. |
| 2004/0164859 | A1 | 8/2004 | Spisa |
| 2005/0248454 | A1 | 11/2005 | Hanson et al. |
| 2005/0286760 | A1 | 12/2005 | Ohtomo et al. |
| 2006/0047419 | A1 | 3/2006 | Diendorf et al. |
| 2006/0086913 | A1 | 4/2006 | Spahn |
| 2006/0097171 | A1 | 5/2006 | Balchunas et al. |
| 2007/0044539 | A1* | 3/2007 | Sabol ............... G06Q 10/06 73/19.01 |
| 2007/0143079 | A1 | 6/2007 | Duxbury et al. |
| 2007/0195712 | A1 | 8/2007 | Thayer et al. |
| 2007/0222585 | A1 | 9/2007 | Sabol et al. |
| 2007/0265866 | A1 | 11/2007 | Fehling et al. |
| 2008/0036585 | A1 | 2/2008 | Gould |
| 2008/0191871 | A1 | 8/2008 | Horak et al. |
| 2008/0249791 | A1 | 10/2008 | Iyer |
| 2008/0271143 | A1 | 10/2008 | Stephens et al. |
| 2009/0006589 | A1 | 1/2009 | Forbes et al. |
| 2009/0033487 | A1 | 2/2009 | McFadden et al. |
| 2009/0063122 | A1 | 3/2009 | Nasle |
| 2009/0119142 | A1 | 5/2009 | Yenni et al. |
| 2009/0153438 | A1 | 6/2009 | Miller et al. |
| 2009/0201896 | A1 | 8/2009 | Davis et al. |
| 2009/0236538 | A1 | 9/2009 | Frank |
| 2010/0274592 | A1 | 10/2010 | Nitzan et al. |
| 2010/0315242 | A1 | 12/2010 | Bullard et al. |
| 2011/0074596 | A1 | 3/2011 | Frohlick et al. |
| 2011/0096319 | A1 | 4/2011 | Otani et al. |
| 2011/0148905 | A1 | 6/2011 | Simmons et al. |
| 2011/0153655 | A1 | 6/2011 | Kim et al. |
| 2011/0161885 | A1 | 6/2011 | Gonia et al. |
| 2011/0193704 | A1 | 8/2011 | Harper et al. |
| 2012/0001754 | A1 | 1/2012 | Kraus et al. |
| 2012/0002733 | A1 | 1/2012 | Misra et al. |
| 2012/0042326 | A1 | 2/2012 | Jain et al. |
| 2012/0140063 | A1 | 6/2012 | Shimada et al. |
| 2012/0150783 | A1 | 6/2012 | Jung et al. |
| 2012/0197911 | A1 | 8/2012 | Banka et al. |
| 2012/0212574 | A1 | 8/2012 | Blumenfeld |
| 2012/0280798 | A1 | 11/2012 | Li et al. |
| 2012/0313779 | A1 | 12/2012 | Papaefstathiou et al. |
| 2012/0323623 | A1 | 12/2012 | Sabharwal |
| 2013/0009780 | A1 | 1/2013 | Marshall et al. |
| 2013/0124597 | A1 | 5/2013 | Diao et al. |
| 2013/0176467 | A1 | 7/2013 | Lin |
| 2013/0184031 | A1 | 7/2013 | Pollington et al. |
| 2013/0262349 | A1 | 10/2013 | Bouqata et al. |
| 2013/0304385 | A1 | 11/2013 | William |
| 2013/0338465 | A1 | 12/2013 | Taub et al. |
| 2014/0028457 | A1 | 1/2014 | Reinpoldt et al. |
| 2014/0046504 | A1 | 2/2014 | Shachor et al. |
| 2014/0074982 | A1 | 3/2014 | Misra et al. |
| 2014/0118123 | A1 | 5/2014 | Lim et al. |
| 2014/0197959 | A1 | 7/2014 | Tarmey et al. |
| 2014/0224964 | A1 | 8/2014 | Solomon et al. |
| 2014/0245808 | A1 | 9/2014 | Pradhan et al. |
| 2014/0266793 | A1 | 9/2014 | Velado et al. |
| 2014/0278646 | A1 | 9/2014 | Adrian et al. |
| 2014/0280319 | A1 | 9/2014 | Rishe |
| 2014/0287782 | A1 | 9/2014 | Davis et al. |
| 2014/0347186 | A1 | 11/2014 | Harper et al. |
| 2014/0347483 | A1 | 11/2014 | Nakanishi et al. |
| 2014/0372565 | A1 | 12/2014 | Klemets et al. |
| 2015/0101269 | A1 | 4/2015 | Moreno et al. |
| 2015/0178657 | A1 | 6/2015 | Kleehammer et al. |
| 2015/0189005 | A1 | 7/2015 | Dubois et al. |
| 2015/0192682 | A1 | 7/2015 | Valentino et al. |
| 2015/0213631 | A1 | 7/2015 | Broek |
| 2015/0213703 | A1 | 7/2015 | Filson et al. |
| 2015/0248275 | A1 | 9/2015 | Gallo et al. |
| 2015/0339594 | A1 | 11/2015 | Gallo et al. |

FOREIGN PATENT DOCUMENTS

| | | |
|---|---|---|
| KR | 100900937 B1 | 6/2009 |
| KR | 1020110053145 A | 5/2011 |
| KR | 1020130038549 A | 4/2013 |
| KR | 1020130115445 A | 10/2013 |

OTHER PUBLICATIONS

International Search Report and Written Opinion for serial No. PCT/US2015/031632 dated Aug. 27, 2015.
Department of Climate Change and Energy Efficiency, National Greenhouse and Energy Reporting System Measurement: Technical Guidelines for the estimation of greenhouse gas emissions by facilities in Australia (Department of Climate Change and Energy Efficiency, 2012).
Gunther Schadow et al., The Unified Code for Units of Measure, (2009) http://web.archive.org/web/20130116071912/http://unitsofmeasure.org/ucum.html.
International Search Report for serial No. PCT/US2015/031632 dated Aug. 27, 2015.
International Search Report for serial No. PCT/US2015/031644 dated Aug. 27, 2015.
International Search Report for serial No. PCT/US2015/031825 dated Aug. 11, 2015.
International Search Report for serial No. PCT/US2015/031835 dated Aug. 26, 2015.

* cited by examiner

SENSOR BASED DETECTION SYSTEM

RELATED APPLICATIONS

This application is a continuation in part of U.S. patent application Ser. No. 14/281,901, filed May 20, 2014, entitled "SENSOR MANAGEMENT AND SENSOR ANALYTICS SYSTEM", by Joseph L. Gallo et al. and incorporated by reference herein.

This application is a continuation in part U.S. patent application Ser. No. 14/281,904, filed May 20, 2014, entitled "EVENT MANAGEMENT FOR A SENSOR BASED DETECTION SYSTEM", by Joseph L. Gallo et al. and incorporated by reference herein.

BACKGROUND

As technology has advanced, computing technology has proliferated to an increasing number of areas while decreasing in price. Consequently, devices such as smartphones, laptops, GPS, etc., have become prevalent in our community, thereby increasing the amount of data being gathered in an ever increasing number of locations. Unfortunately, most of the gathered information is used for marketing and advertising to the end user, e.g., smartphone user receives a coupon to a nearby coffee shop, etc., while the security of our community is left exposed and at a risk of terrorist attacks such as the Boston Marathon bombers.

SUMMARY

Accordingly, a need has arisen for a solution to allow monitoring and collection of data from a plurality of sensors and management of the plurality of sensors for improving security of our communities, e.g., by detecting radiation, etc. Further, there is a need to provide relevant information based on the sensors in an efficient manner to increase security.

Embodiments provide a unique methods and systems for monitoring and managing a variety of network (e.g., internet protocol (IP)) connected sensors. Embodiments are configured to allow monitoring (e.g., continuous real-time monitoring, sporadic monitoring, scheduled monitoring, etc.) of sensors and associated sensor readings or data (e.g., ambient sensor readings). For example, gamma radiation levels may be monitored in the context of background radiation levels. Accordingly, a significant change in the background gamma radiation levels may indicate a presence of hazardous radioactive material, bomb, etc. As a result, appropriate actions may be taken to avert a possible security breach, terrorist activity, etc. Embodiments may support any number of sensors and may scale upwards as more sensors are added or downwards as needed. Embodiments thus provide a universal sensor monitoring, management, and alerting platform.

One embodiment is directed to a method for monitoring and managing sensors. The method includes receiving a data stream at an interval, wherein the data stream is associated with a sensor and determining whether the data stream at the interval satisfies a certain criteria to trigger an alert. The method may further include in response to determining that the data stream satisfies the certain criteria, sending the alert and displaying information associated with the data stream of the sensor on a graphical user interface. In some embodiments, the certain criteria are whether the data stream at the interval exceeds a threshold. In some embodiments, the alert is a message transmitted to indicate that a hazardous material has been detected by the sensor. In some embodiments, the sensor comprises a complementary metal-oxide-semiconductor (CMOS) component operable for detecting gamma radiation. In some embodiments, the method may further include rendering a map, where the sensor is shown on the map based on a location of the sensor. In some embodiments, the determining is further based on other sensors within a selected proximity of the sensor. In some embodiments, the method may further include storing the data stream at the interval. In some embodiments, the method may further include responsive to a selection of the sensor via a graphical user interface, rendering the data stream at the interval on the graphical user interface.

One embodiment is directed to a system for monitoring and managing sensors. The system includes a process module configured to analyze a current sensor data from an associated sensor of a plurality of sensors and a sensor management module configured to manage a plurality of instances of the process module. The sensor management module is further configured to associate metadata of the associated sensor with the current sensor data. The system may further include a state management module configured to determine whether a state change of the associated sensor has occurred. The determination is based on a comparison between the current sensor data and a previous sensor data.

In some embodiments, the system may further include a data store module configured to receive the metadata and the current sensor data. The data store module is further configured to store the metadata and the current sensor data. In some embodiments, the data store module comprises the state determination module. In some embodiments, the system may further include a visualization module configured to display the current sensor data and a representation of the associated sensor based on the metadata. In some embodiments, the visualization module is configured to display the current sensor data. The current sensor data is visually positioned in close proximity to geographical location of the associated sensor on a map. In some embodiments, the system may further include a messaging module configured to send a message based on the current sensor data, the metadata, and further based on whether the current sensor data satisfies a certain condition. In some embodiments, the sensor management module is configured to determine a health of each instance of the process module of the plurality of instances of the process module.

One embodiment is directed to a system for monitoring and managing sensors. The system includes a plurality of radiation sensors and a sensor based detection system coupled to the plurality of radiation sensors. The sensor detection system is configured to monitor, manage, and analyze data from the plurality of radiation sensors. In some embodiments, at least one sensor of the plurality of radiation sensors comprises a complementary metal-oxide-semiconductor (CMOS) component. In some embodiments, the sensor based detection system is configured to determine a health of a respective analytics process associated with a respective radiation sensor of the plurality of radiation sensors. In some embodiments, the sensor based detection system is configured to display sensor data and metadata of a radiation sensor of the plurality of radiation sensors. In some embodiments, the sensor based detection system is configured to store the sensor data and the metadata. In some embodiments, the sensor based detection system is configured to send a message based on the sensor data and the metadata. In some embodiments, the sensor based detection system is configured to determine a sensor state change based on a previous sensor reading.

These and various other features and advantages will be apparent from a reading of the following detailed description.

BRIEF DESCRIPTION OF DRAWINGS

The embodiments are illustrated by way of example, and not by way of limitation, in the figures of the accompanying drawings and in which like reference numerals refer to similar elements.

DETAILED DESCRIPTION

Figure 1:
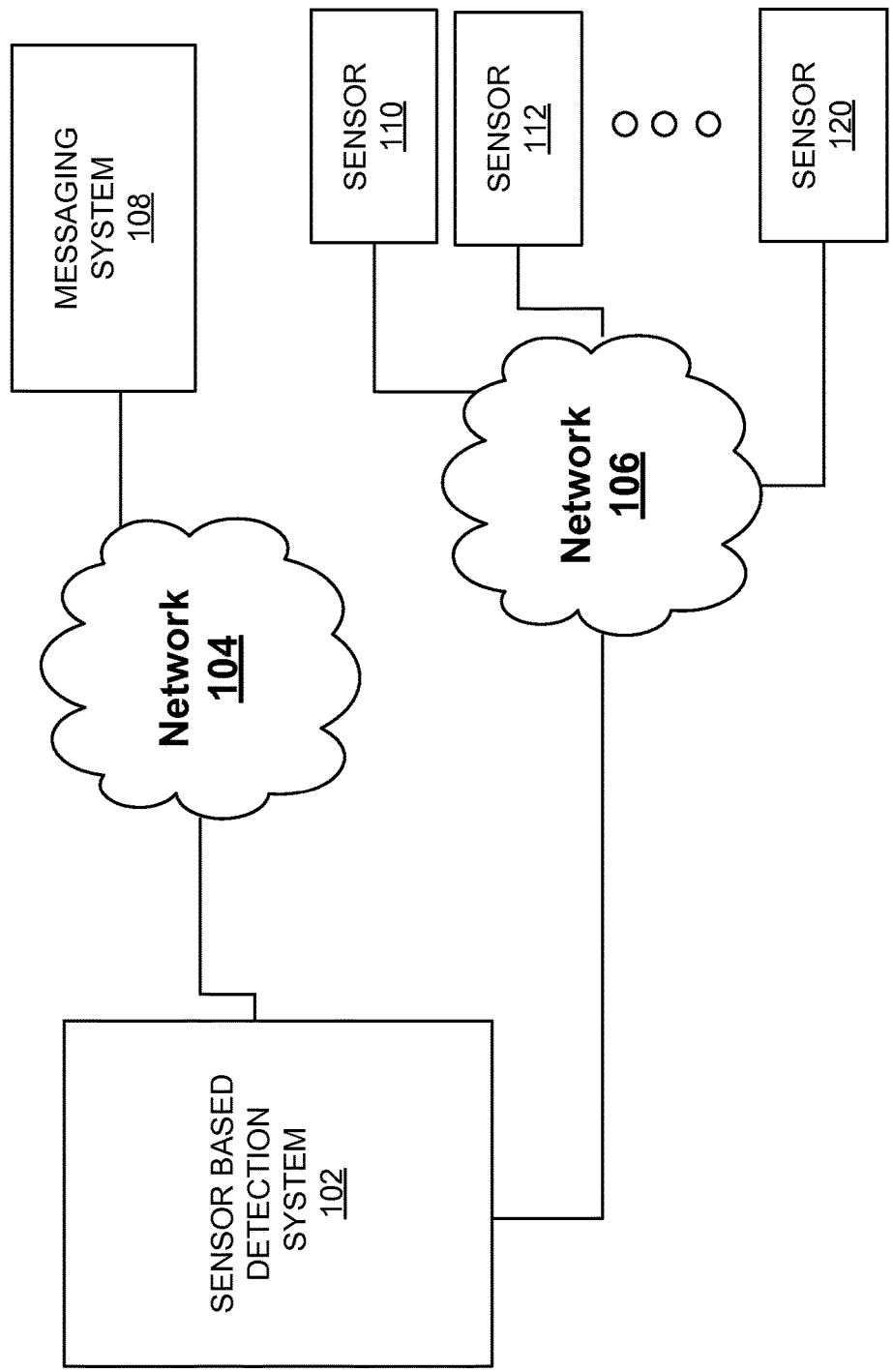
FIG. 1 shows an exemplary operating environment in accordance with one embodiment.

Reference will now be made in detail to various embodiments, examples of which are illustrated in the accompanying drawings. While the claimed embodiments will be described in conjunction with various embodiments, it will be understood that these various embodiments are not intended to limit the scope of the embodiments. On the contrary, the claimed embodiments are intended to cover alternatives, modifications, and equivalents, which may be included within the scope of the appended Claims. Furthermore, in the following detailed description, numerous specific details are set forth in order to provide a thorough understanding of the claimed embodiments. However, it will be evident to one of ordinary skill in the art that the claimed embodiments may be practiced without these specific details. In other instances, well known methods, procedures, components, and circuits are not described in detail so that aspects of the claimed embodiments are not obscured.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of operations or steps or instructions leading to a desired result. The operations or steps are those utilizing physical manipulations of physical quantities. Usually, although not necessarily, these quantities take the form of electrical or magnetic signals capable of being stored, transferred, combined, compared, and otherwise manipulated in a computer system or computing device. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving," "converting," "transmitting," "storing," "determining," "sending," "querying," "providing," "accessing," "associating," "configuring," "initiating," "customizing", "mapping," "modifying," "analyzing," "displaying," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

It is appreciated that present systems and methods can be implemented in a variety of architectures and configurations. For example, present systems and methods can be implemented as part of a distributed computing environment, a cloud computing environment, a client server environment, etc. Embodiments described herein may be discussed in the general context of computer-executable instructions residing on some form of computer-readable storage medium, such as program modules, executed by one or more computers, computing devices, or other devices. By way of example, and not limitation, computer-readable storage media may comprise computer storage media and communication media. Generally, program modules include routines, programs, objects, components, data structures, etc., that perform particular tasks or implement particular abstract data types. The functionality of the program modules may be combined or distributed as desired in various embodiments.

Computer storage media can include volatile and non-volatile, removable and non-removable media implemented in any method or technology for storage of information such as computer-readable instructions, data structures, program modules, or other data, that are non-transitory. Computer storage media can include, but is not limited to, random access memory (RAM), read only memory (ROM), electrically erasable programmable ROM (EEPROM), flash memory, or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared and other wireless media. Combinations of any of the above can also be included within the scope of computer-readable storage media.

Sensor Based Detection Systems and Methods

A need has arisen for a solution to allow monitoring and collection of data from a plurality of sensors and management of the plurality of sensors for improving security of our communities, e.g., by detecting radiation, etc. Further, there is a need to provide relevant information based on the sensors in an efficient manner to increase security.

Embodiments provide methods and systems for monitoring and managing a variety of network (e.g., internet protocol (IP)) connected sensors. Embodiments are configured to allow monitoring (e.g., continuous real-time monitoring, sporadic monitoring, scheduled monitoring, etc.) of sensors and associated sensor readings or data (e.g., ambient sensor readings). For example, gamma radiation levels may be monitored in the context of background radiation levels. Accordingly, a significant change in the background gamma radiation levels may indicate a presence of hazardous radioactive material, bomb, etc. As a result, appropriate actions may be taken to avert a possible security breach, terrorist activity, etc. Embodiments may support any number of sensors and may be scaled upwards or downwards as desired. Embodiments thus provide a universal sensor monitoring, management, and alerting platform.

Embodiments provide analytics, archiving, status (e.g., real time status, sporadic monitoring, scheduled monitoring, etc.), graphical user interface based monitoring and management, and messaging related to any sensor based detection that may pose a risk to the community. Embodiments may provide a solution for monitoring, managing, alerting, and messaging related to certain sensor detection, e.g., gamma radiation detection, air quality detection, water and level quality detection, fire detection, flood detection, biological and chemical detection, air pressure detection, particle count detection, movement and vibration detection, etc. For example, the embodiments may provide a solution for monitoring and tracking movement of hazardous materials or conditions, thereby allowing initiation of public responses and defense mechanisms. Embodiments may allow previously installed devices (e.g., surveillance cameras, smartphones, vibration detection sensors, $CO_2$ detection sensors, particle detection sensors, air pressure detection sensors, infrared detection sensors, etc.) to be used as sensors to detect hazardous conditions (e.g., radioactive, biological, chemical, etc.). Embodiments may be used in a variety of environments, including public places or venues (e.g., airports, bus terminals, stadiums, concert halls, tourist attractions, public transit systems, etc.), organizations (e.g., businesses, hospitals, freight yards, government offices, defense establishments, nuclear establishments, laboratories, etc.), etc. For example, embodiments may be used to track sensitive material (e.g., nuclear, biological, chemical, etc.) to ensure that it is not released to the public and prevent introduction of the material into public areas. Embodiments may thus be further able to facilitate a rapid response to terrorist threats (e.g., a dirty bomb). It is appreciated that the embodiments are described herein within the context of radiation detection and gamma ray detection for merely illustrative purposes and are not intended to limit the scope.

FIG. 1 shows an exemplary operating environment in accordance with one embodiment. Exemplary operating environment 100 includes a sensor based detection system 102, a network 104, a network 106, a messaging system 108, and sensors 110-120. The sensor based detection system 102 and the messaging system 108 are coupled to a network 104. The sensor based detection system 102 and messaging system 108 are communicatively coupled via the network 104. The sensor based detection system 102 and sensors 110-120 are coupled to a network 106. The sensor based detection system 102 and sensors 110-120 are communicatively coupled via network 106. Networks 104, 106 may include more than one network (e.g., intranets, the Internet, local area networks (LAN)s, wide area networks (WAN)s, etc.) and may be a combination of one or more networks including the Internet. In some embodiments, network 104 and network 106 may be a single network.

The sensors 110-120 detect a reading associated therewith, e.g., gamma radiation, vibration, etc., and transmit that information to the sensor based detection system 102 for analysis. The sensor based detection system 102 may use the received information and compare it to a threshold value, e.g., historical values, user selected values, etc., in order to determine whether a potentially hazardous event has occurred. In response to the determination, the sensor based detection system 102 may transmit that information to the messaging system 108 for appropriate action, e.g., emailing the appropriate personnel, sounding an alarm, tweeting an alert, alerting the police department, alerting homeland security department, etc. Accordingly, appropriate actions may be taken in order to avert the risk.

The sensors 110-120 may be any of a variety of sensors including thermal sensors (e.g., temperature, heat, etc.), electromagnetic sensors (e.g., metal detectors, light sensors, particle sensors, Geiger counter, charge-coupled device (CCD), etc.), mechanical sensors (e.g. tachometer, odometer, etc.), complementary metal-oxide-semiconductor (CMOS), biological/chemical (e.g., toxins, nutrients, etc.), etc. The sensors 110-120 may further be any of a variety of sensors or a combination thereof including, but not limited to, acoustic, sound, vibration, automotive/transportation, chemical, electrical, magnetic, radio, environmental, weather, moisture, humidity, flow, fluid velocity, ionizing, atomic, subatomic, navigational, position, angle, displacement, distance, speed, acceleration, optical, light imaging, photon, pressure, force, density, level, thermal, heat, temperature, proximity, presence, radiation, Geiger counter, crystal based portal sensors, biochemical, pressure, air quality, water quality, fire, flood, intrusion detection, motion detection, particle count, water level, surveillance cameras, etc. The sensors 110-120 may be video cameras (e.g., internet protocol (IP) video cameras) or purpose built sensors.

The sensors 110-120 may be fixed in location (e.g., surveillance cameras or sensors), semi-fixed (e.g., sensors on a cell tower on wheels or affixed to another semi portable object), or mobile (e.g., part of a mobile device, smartphone, etc.). The sensors 110-120 may provide data to the sensor based detection system 102 according to the type of the sensors 110-120. For example, sensors 110-120 may be CMOS sensors configured for gamma radiation detection. Gamma radiation may thus illuminate a pixel, which is converted into an electrical signal and sent to the sensor based detection system 102.

The sensor based detection system 102 is configured to receive data and manage sensors 110-120. The sensor based detection system 102 is configured to assist users in monitoring and tracking sensor readings or levels at one or more locations. The sensor based detection system 102 may have various components that allow for easy deployment of new sensors within a location (e.g., by an administrator) and allow for monitoring of the sensors to detect events based on user preferences, heuristics, etc. The events may be used by the messaging system 108 to generate sensor-based alerts (e.g., based on sensor readings above a threshold for one sensor, based on the sensor readings of two sensors within a certain proximity being above a threshold, etc.) in order for the appropriate personnel to take action. The sensor based detection system 102 may receive data and manage any number of sensors, which may be located at geographically disparate locations. In some embodiments, the sensors 110-

120 and components of a sensor based detection system 102 may be distributed over multiple systems (e.g., and virtualized) and a large geographical area.

The sensor based detection system 102 may track and store location information (e.g., board room B, floor 2, terminal A, etc.) and global positioning system (GPS) coordinates, e.g., latitude, longitude, etc. for each sensor or group of sensors. The sensor based detection system 102 may be configured to monitor sensors and track sensor values to determine whether a defined event has occurred, e.g., whether a detected radiation level is above a certain threshold, etc., and if so then the sensor based detection system 102 may determine a route or path of travel that dangerous or contraband material is taking around or within range of the sensors. For example, the path of travel of radioactive material relative to fixed sensors may be determined and displayed via a graphical user interface. It is appreciated that the path of travel of radioactive material relative to mobile sensors, e.g., smartphones, etc., or relative to a mixture of fixed and mobile sensors may similarly be determined and displayed via a graphical user interface. It is appreciated that the analysis and/or the sensed values may be displayed in real-time or stored for later retrieval.

The sensor based detection system 102 may display a graphical user interface (GUI) for monitoring and managing sensors 110-120. The GUI may be configured for indicating sensor readings, sensor status, sensor locations on a map, etc. The sensor based detection system 102 may allow review of past sensor readings and movement of sensor detected material or conditions based on stop, play, pause, fast forward, and rewind functionality of stored sensor values. The sensor based detection system 102 may also allow viewing of image or video footage corresponding to sensors that had sensor readings above a threshold (e.g., based on a predetermined value or based on ambient sensor readings). For example, a sensor may be selected in a GUI and video footage associated with an area within a sensor's range of detection may be displayed, thereby enabling a user to see an individual transporting hazardous material. According to one embodiment the footage is displayed in response to a user selection or it may be displayed automatically in response to a certain event, e.g., sensor reading associated with a particular sensor or group of sensors being above a certain threshold.

In some embodiments, sensor readings of one or more sensors may be displayed on a graph or chart for easy viewing. A visual map-based display depicting sensors may be displayed with the sensors color coded according to the sensors' readings and certain events. For example, gray may be associated with a calibrating sensor, green may be associated with a normal reading from the sensor, yellow may be associated with an elevated sensor reading, orange associated with a potential hazard sensor reading, and red associated with a hazard alert sensor reading.

The sensor based detection system 102 may determine alerts or sensor readings above a specified threshold (e.g., predetermined, dynamic, or ambient based) or based on heuristics and display the alerts in the graphical user interface (GUI). The sensor based detection system 102 may allow a user (e.g., operator) to group multiple sensors together to create an event associated with multiple alerts from multiple sensors. For example, a code red event may be created when three sensors or more within twenty feet of one another and within the same physical space have a sensor reading that is at least 40% above the historical values. In some embodiments, the sensor based detection system 102 may automatically group sensors together based on geographical proximity of the sensors, e.g., sensors of gates 1, 2, and 3 within terminal A at LAX airport may be grouped together due to their proximate location with respect to one another, e.g., physical proximity within the same physical space, whereas sensors in different terminals may not be grouped because of their disparate locations. However, in certain circumstances sensors within the same airport may be grouped together in order to monitor events at the airport and not at a more granular level of terminals, gates, etc.

The sensor based detection system 102 may send information to a messaging system 108 based on the determination of an event created from the information collected from the sensors 110-120. The messaging system 108 may include one or more messaging systems or platforms which may include a database (e.g., messaging, SQL, or other database), short message service (SMS), multimedia messaging service (MMS), instant messaging services, Twitter™ available from Twitter, Inc. of San Francisco, Calif., Extensible Markup Language (XML) based messaging service (e.g., for communication with a Fusion center), JavaScript™ Object Notation (JSON) messaging service, etc. For example, national information exchange model (NIEM) compliant messaging may be used to report chemical, biological, radiological and nuclear defense (CBRN) suspicious activity reports (SARs) to report to government entities (e.g., local, state, or federal government).

Figure 2:
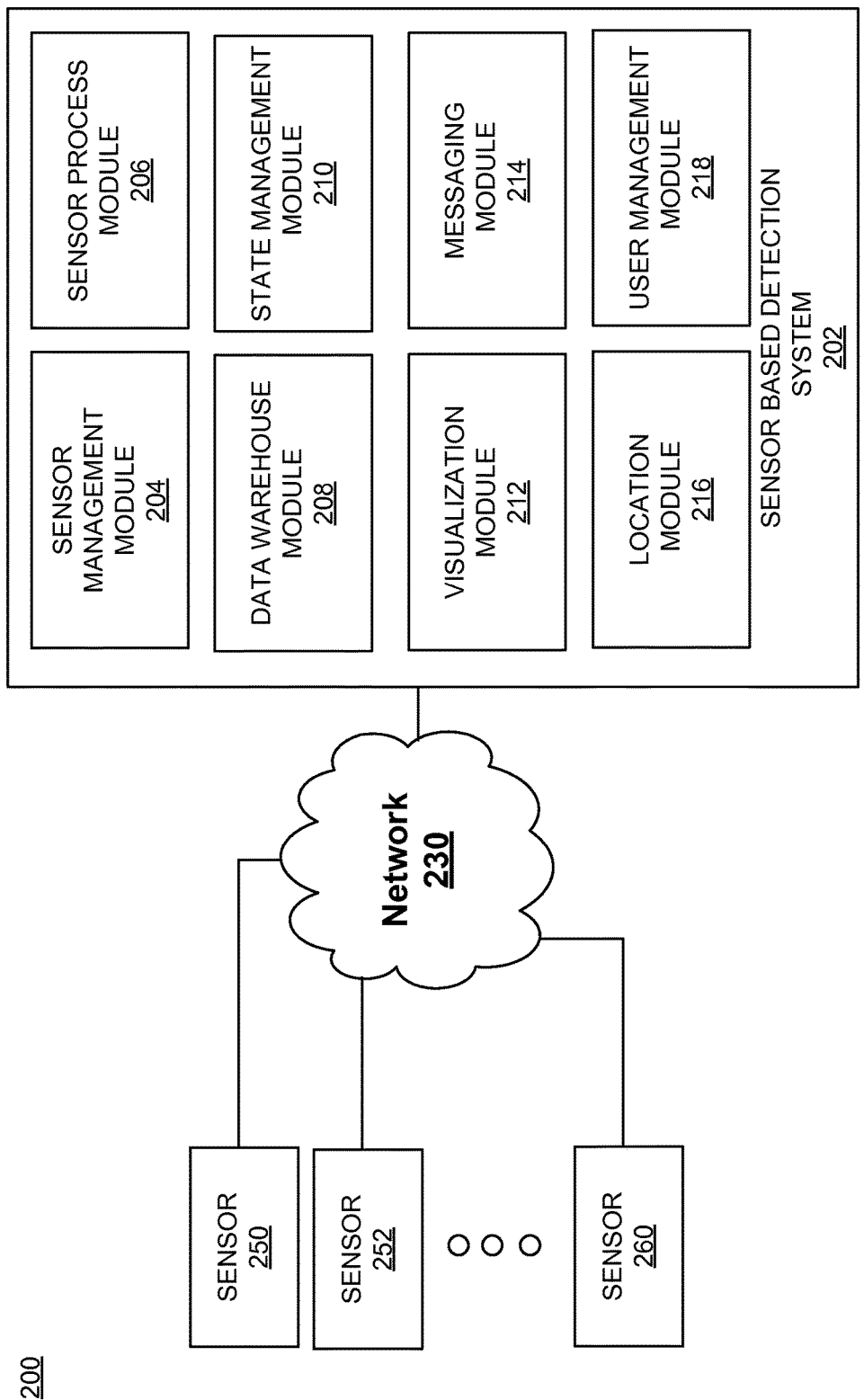
FIG. 2 shows exemplary components of a sensor based detection system in accordance with one embodiment.

FIG. 2 shows exemplary components of a sensor based detection system in accordance with one embodiment. Diagram 200 includes sensors 250-260, a network 230, and a sensor based detection system 202. The sensor based detection system 202 and sensors 250-260 are communicatively coupled via network 230. The network 230 may include more than one network (e.g., intranets, the Internet, LANs, WANs, etc.) and may be a combination of one or more networks including the Internet. In some embodiments, the sensors 250-260 may be substantially similar to sensors 110-120 and may be any of a variety of sensors, as described herein.

The sensor based detection system 202 may access or receive data from the sensors 250-260. The sensor based detection system 202 may include a sensor management module 204, a sensor process module 206, a data warehouse module 208, a state management module 210, a visualization module 212, a messaging module 214, a location module 216, and a user management module 218.

In some embodiments, the sensor based detection system 202 may be distributed over multiple servers (e.g., physical or virtual machines). For example, a domain server may execute the data warehouse module 208 and the visualization module 212, a location server may execute the sensor management module 204 and one or more instances of a sensor process module 206, and a messaging server may execute the messaging module 214. For example, multiple location servers may each be located at respective sites having 100 sensors, and provide analytics to a single domain server, which provides a monitoring and management interface (e.g., GUI) and messaging services. The domain server may be centrally located while the location servers may be located proximate to the sensors for bandwidth purposes.

The sensor management module 204 is configured to monitor and manage the sensors 250-260. The sensor management module 204 is configured to initiate one or more instances of sensor process module 206 for monitoring and managing sensors 250-260. The sensor management module 204 is operable to configure a new sensor process (e.g., an instance of sensor process module 206) when a new sensor is installed. The sensor management module 204 may thus initiate execution of multiple instances of the sensor process module 206. In some embodiments, an instance of the sensor process module 206 is executed for each sensor. For example, if there are 50 sensors, 50 instances of sensor process module 206 are executed in order to configure the sensors. It is further appreciated that the sensor management module 204 may also be operable to configure an already existing sensor. For example, sensor 252 may have been configured previously, however, the sensor management module 204 may reconfigure sensor 252 based on the new configuration parameters. The sensor management module 204 may be configured as an aggregator and collector of data from the sensors 250-260 via sensor process module 206. Sensor management module 204 is configured to send data received via instances of sensor process module 206 to a data warehouse module 208.

The sensor management module 204 further allows monitoring of one or more instances of the sensor process module 206 to determine whether an instance of the sensor process module 206 is running properly or not. In some embodiments, the sensor management module 204 is configured to determine the health of one or more sensors including if a sensor has failed based on whether an anticipated or predicted value is received within a certain time period. The sensor management module 204 may further be configured to determine whether data is arriving on time and whether the data indicates that the sensor is functioning properly (e.g. healthy) or not. For example, a radiation sensor may be expected to provide a certain microsievert (mSv) value within a given time period. In some embodiments, the anticipated value may be received from an analytics engine that analyzes the sensor data. In some embodiments, the sensor management module 204 may be configured to receive an indicator of status from a sensor (e.g., an alive signal, an error signal, or an on/off signal). The health information may be used for management of the sensors 250-260 and the health information associated with the sensors may be stored in the data warehouse 208.

The sensor management module 204 may further access and examine the outputs from the sensors based on a predictable rate of output. For example, an analytics process (e.g., performed by the sensor process module 206) associated with a sensor may produce a record every ten seconds and if a record is not received (e.g., within multiple 10 second periods of time), the sensor management module 204 may stop and restart the analytics process. In some embodiments, the record may be a flat file.

The sensor process module 206 is configured to receive data (e.g., bulk or raw data) from sensors 250-260. In some embodiments, the sensor process module 206 may form a record (e.g. a flat file) based on the data received from the sensors 250-260. The sensor process module 206 may perform analysis of the raw data (e.g., analyze frames of video to determine sensor readings). In some embodiments, the sensor process module 206 may then pass the records to the sensor management module 204.

The data warehouse module 208 is configured to receive data from sensor management module 204. The data warehouse module 208 is configured for storing sensor readings and metadata associated with the sensors. Metadata for the sensors may include their respective geographical information (e.g., GPS coordinates, latitude, longitude, etc.), description of the sensor, e.g., sensor at gate 1 terminal A at LAX, etc. In some embodiments, the data warehouse module 208 may be configured to determine state changes based on monitoring (e.g., real time monitoring) of the state of each sensor and the state of the sensor over a time interval (e.g., 30 seconds, 1 minute, 1 hour, etc.). In some embodiments, the data warehouse module 208 is configured to generate an alert (e.g., when a sensor state has changed and is above a threshold, when a sensor reading satisfies a certain condition such as being below a threshold, etc.). The generated alert may be sent to visualization module 212 for display (e.g., to a user). Changes in sensor state may thus be brought to the attention of a user (e.g., operator). It is appreciated that the threshold values may be one or more historical values, safe readings, operator selected values, etc.

In some embodiments, the data warehouse module 208 may be implemented in a substantially similar manner as described in Philippines Patent Application No. 1-2013-000136 entitled "A Domain Agnostic Method and System for the Capture, Storage, and Analysis of Sensor Reading", by Ferdinand E. K. De Antoni which is incorporated by reference herein.

The state management module 210 may read data from the data warehouse module 208 and/or from the sensor management module 204 (e.g., data that was written by sensor management module 204) and determine whether a state change has occurred. The state change may be determined based on a formula to determine whether there has been a change since a previous record in time for an associated sensor and may take into account ambient sensor readings. If there is a change in state, an alert may be triggered. It is appreciated that that state may also be a range of values. One or more alerts may be assembled (e.g., into a data structure) referred to as an event. The event may then be accessed by or sent to a visualization module 212. The visualization module 212 may then display the change in state, an alert, or an event. In some embodiments, the visualization module 212 may receive input to have the alert sent to an external system (e.g., a messaging system).

The visualization module 212 is configured for use in monitoring a location for potential sensor based alerts. The visualization module 212 may provide a graphical user interface (GUI) to monitor and manage each of the deployed sensors. In some embodiments, the visualization module 212 is configured to provide a tree filter to view each of the sensors in a hierarchical manner, as well as a map view, thereby allowing monitoring of each sensor in a geographical context. The visualization module 212 may further allow creation of an event case file to capture sensor alerts at any point in time and escalate the sensor alert to appropriate authorities for further analysis (e.g., via a messaging system). The visualization module 212 may display a path of travel or route of hazardous materials or conditions based on sensor readings and the associated sensor locations. The visualization module 212 may further be used to zoom in and zoom out on a group of sensors, e.g., sensors within a terminal at an airport, etc. As such, the information may be displayed as granular as desired by the operator. Visualization module 212 may also be used and render information in response to a user manipulation. For example, in response to a user selection of a sensor, e.g., sensor 260, the sensor readings associated with the sensor may be displayed. In another example, a video feed associated with the sensor may also be displayed (e.g., simultaneously).

The messaging module 214 is configured to send messages to other systems or messaging services including, but not limited to, a database (e.g., messaging, SQL, or other database), short message service (SMS), multimedia messaging service (MMS), instant messaging services, Twitter available from Twitter, Inc. of San Francisco, Calif., Extensible Markup Language (XML) based messaging service (e.g., for communication with a Fusion center), JavaScript Object Notation (JSON) messaging service, etc. In one example, national information exchange model (NIEM) compliant messaging may be used to report chemical, biological, radiological and nuclear defense (CBRN) suspicious activity reports (SARs) to report to government entities (e.g., local, state, or federal government). In some embodiments, the messaging module 214 may send messages based on data received from the sensor management module 204. It is appreciated that the messages may be formatted to comply with the requirement/standards of the messaging service used. For example, as described above a message may be formed into the NIEM format in order to repot a CBRN event.

The location module 216 is configured for mapping and spatial analysis (e.g., triangulation) in order to graphically represent the sensors within a location. For example, location module 216 may be configured to facilitate display of the location of and associated icons for sensors at each gate of an airport terminal. In some embodiments, the sensor management module 204 is configured to store geographical data associated with a sensor in a data store (not shown) associated with location module 216. In some embodiments, the location module 216 may operate in conjunction with ArcGIS from ERSI, Inc. of Redlands, Calif. It is appreciated that the location module 216 may be used to provide mapping information associated with the sensor location such that the location of the sensor may overlay the map, e.g., location of the sensor may overlay the map of LAX airport, etc.

The user management module 218 is configured for user management and storage of user identifiers of operators and administrators. The user management portion may be integrated with an existing user management systems (e.g., OpenLDAP or Active Director) thereby enabling use of existing user accounts to operate sensor the based detection system 202.

Figure 3:
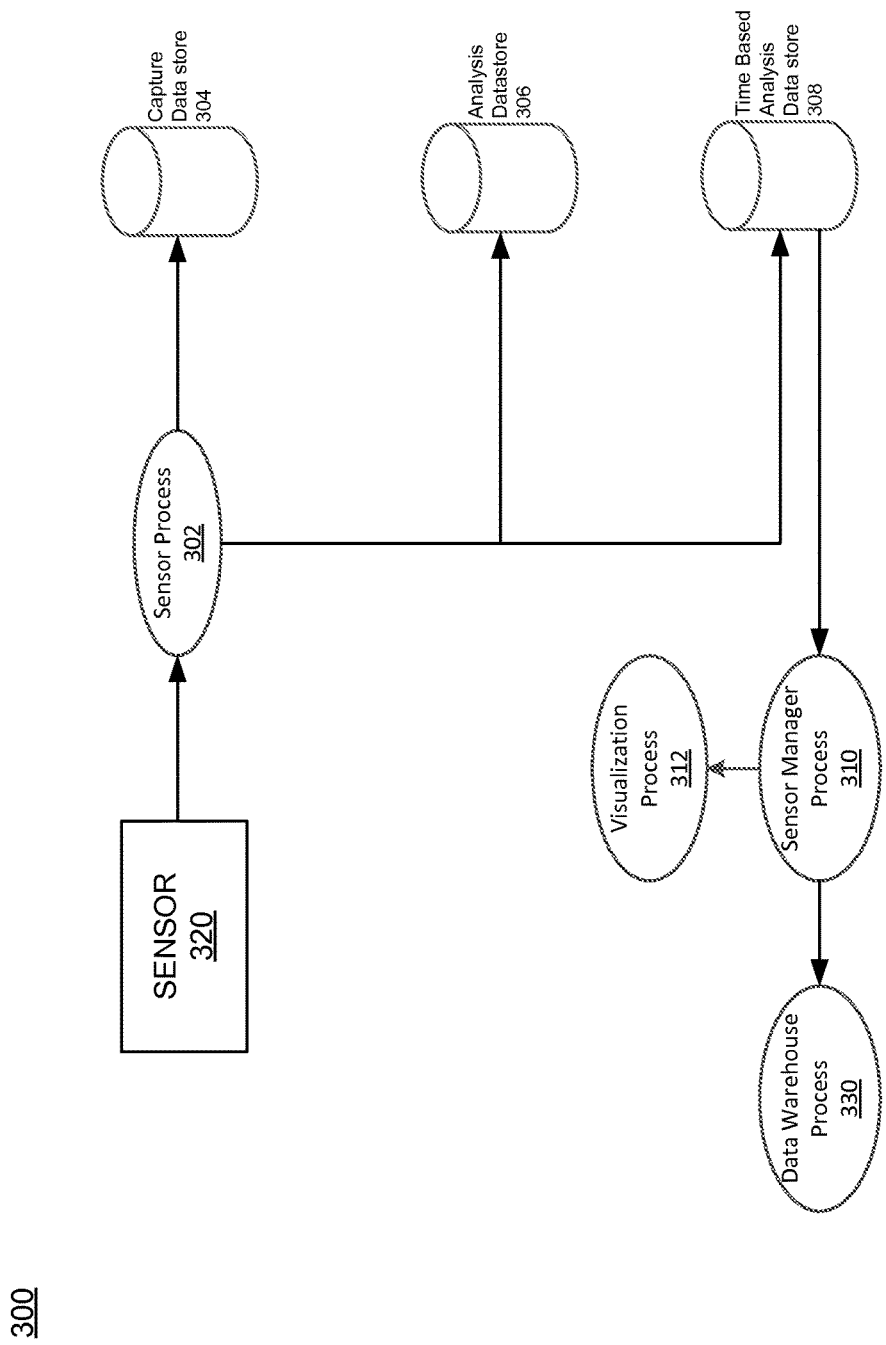
FIG. 3 shows an exemplary data flow diagram in accordance with one embodiment.

FIG. 3 shows an exemplary data flow diagram in accordance with one embodiment. The diagram 300 includes a sensor 320, a sensor process 302, a capture data store 304, an analysis data store 306, a time-based analysis data store 308, a sensor manager process 310, a visualization process 312, and a data warehouse process 330. In some embodiments, a sensor process 302, a sensor manager process 310, and a visualization process 312 may execute on one or more computing systems. The data stores 304-308 may be part of or stored in a data warehouse (e.g., stored by data warehouse process 330 in data warehouse module 208).

The sensor 320 may be substantially similar to sensors 110-120 and may be any of a variety of sensors as described herein. The sensor 320 may provide data (e.g., as camera stream data) to the sensor process 302.

Sensor manager process 310 is configured to initiate or launch one or more instances of a sensor process 302. The sensor manager process 310 is operable to configure each instance of the sensor process 302 based on configuration parameters (e.g., preset or configured by a user).

The sensor process 302 may be configured by a sensor manager process 310 to organize sensor readings over particular time intervals (e.g., 30 seconds, one minute, one hour, one day, one week, one year). In some embodiments, an instance of the sensor process 302 may be executed for each time interval. For example, five instances of the sensor process 302 may be executed for 30 second, one minute, one hour, one day, and one week intervals respectively. Thus, with five time intervals and seven sensors, 35 instances of the sensor process 302 may be executed. The use of time intervals allows ambient sensor readings (e.g., ambient radiation readings) to be filtered out and determination of the accumulation of dangerous materials or conditions over time. For example, sensor readings at one month intervals will be show a huge difference from its previous readings in comparison to the same sensor readings as compared to its readings at one hour intervals if hazardous material has been accumulating at a given location over the course of a year. Accordingly, different time intervals can be used to provide additional information and insight into specific sensor(s) readings that may have otherwise been overlooked.

The sensor process 302 or other instances of the sensor process 302 may be added or removed as needed. For example, when a new sensor is added, a sensor manager process 310 may be used (e.g., by an administrator) to configure one or more instances of the sensor process 302 to receive a data stream from the new sensor and generate analyzed data (e.g., preprocessed sensor data). In some embodiments, an administrator may add additional instances of the sensor process 302 or remove instances of the sensor process 302 (e.g., that are no longer needed) using the sensor manager process 310. In some embodiments, the sensor manager process 310 includes a management interface that allows a user (e.g., administrator) to monitor the status of each sensor process 302 and investigate any possible errors that occur. An administrator may also monitor the data warehouse process 330 to ensure that data storage is occurring at an optimal or desired rate. In some embodiments, various clustering and sharding options are available to optimize the storage and retrieval of data as desired. Upon launch of an instance of the sensor process 302, the sensor process 302 may run in a calibration mode to calibrate the sensor 320.

In some embodiments, when the sensor process 302 is configured, various pieces of geographical data (e.g., location coordinates, floor level, etc.) associated with the sensor 320 are captured. The geographical data may be sent to a data warehouse process 330 and to a location module (e.g., location module 216) to be used to graphically represent the sensor process 302 on a map. The map may be displayed (e.g., via visualization module 208) for displaying data of the sensor process 302 in a geographical context.

The sensor process 302 may be configured to access or receive data from a sensor 320. Multiple instances of a sensor process 302 may be executed on a per sensor and/or a per time interval basis. In some embodiments, each sensor process 302 is configured to receive data from a sensor 320 at a particular time interval (e.g., every 5 seconds, etc.).

In some embodiments, a first instance of a sensor process 302 may output raw stream data. The capture data may be video streams (e.g., Moving Picture Experts Group (MPEG) video) from the sensor 320. The sensor process 302 may store data received from the sensor 320 to the capture data store 304. In some embodiments, the sensor process 302 stores data (e.g., raw data) received from the sensor 320 into the capture data store 304. For example, the capture data store 304 may be used to store a video stream (e.g., for archival purposes, analysis, litigation, prosecution, etc.).

In some embodiments, the sensor process 302 may utilize frame by frame analysis to detect gamma radiation. In some embodiments, the sensor process 302 determines a calculated rate of micro Sieverts (mSv) per hour.

A second instance of the sensor process 302 may access the raw stream data received directly from the sensor or retrieved from the capture data store 304 and generate converted stream data (e.g., sensor readings or level data). Converted stream data may include a count of the hits on the sensor within a sample interval (e.g., gamma ray sample data). For example, converted stream data may include the number of gamma ray hits that were on sensor 320 within a certain threshold, above a certain threshold, within a range, etc. In some embodiments, the sensor process 302 generates converted stream data that includes various readings from the sensor 320 which are subsequently stored in the analysis data store 306. In some embodiments, the sensor process 302 may perform frame by frame analysis of the data received from the sensor 320. For example, the converted stream data may include the level of gamma radiation detected in a frame.

A third instance of the sensor process 302 may be configured to access the converted stream data and generate preprocessed sensor data, which may be stored in a time based analysis data store 308. Preprocessed sensor data may include an analysis of converted stream data for a given time period. For example, a preprocessed sensor record may be the result of analyzing the previous 5 minutes. The preprocessed sensor data may be stored in a time based analysis data store, which may be sent to the sensor manager process 310 by the sensor process 302 or accessed by the sensor manager process 310. The sensor process 302 or an instance thereof may generate values at regular intervals (e.g., every 10 seconds, every 30 seconds, etc.). For example, the preprocessed sensor data may include sensor readings over a time interval of the previous five minutes and be generated at 10 second intervals. In some embodiments, sensor manager process 310 may receive information from capture data store 304 and/or analysis data store 306.

The sensor manager process 310 may then forward the data (e.g., preprocessed sensor data) from the sensor process 302 to the data warehouse 330 for storage. In some embodiments, the sensor management process 310 may also send received data to a visualization process 312 and a data warehouse 330. Visualization process 312 may access the preprocessed sensor data (e.g., from sensor manager process 310 or data warehouse process 330) and display the preprocessed sensor data in a graphical user interface.

In some embodiments, the sensor process 302 may send data from a time based analysis data store 308 (e.g., preprocessed sensor data) to a data warehouse process 330. In some embodiments, the data warehouse 330 may determine whether sensor readings exceed ambient sensor readings or whether there has been a change in the state of the sensor. For example, with gamma radiation, the data warehouse process 330 may determine if gamma radiation sensor readings are from gamma radiation from a natural source (e.g., the sun), other natural ambient source, or from radioactive material (e.g., that is being transported within range of a sensor). In one exemplary embodiment, it is determined whether the gamma radiation reading is within a safe range or whether the reading is outside of the safe range.

The data warehouse 330 may be configured to analyze sensor readings for a possible change in status of the sensor. For example, the sensor 320 may have five possible states: calibration (CALIB), nominal (NOMNL), elevated (ELEVT), potential (POTEN), and alert (ALERT). In some embodiments, the data warehouse 330 is configured to generate an alert if there is a change in the status of a sensor process 302.

Alerts generated from the data warehouse process 330 may be sent or pushed to a visualization process 312 so that a user (e.g., operator) may be notified visually, audibly, etc. The user may have the opportunity to inspect various data that the sensor process 302 has generated (e.g. mSv values) and generate an appropriate event case file including the original sensor process 302 data (e.g. raw stream data, converted stream data, preprocessed sensor data, etc.) that triggered the alert.

The sensor manager process 310 may also send the data from time based analysis data store 308 to the visualization process 312 for display to a user (e.g., operator, administrator, etc.). In some embodiments, the sensor manager process 310 sends the data to a visualization process 312 in a message based format. To show a sensor and alert geographically, location functionality (e.g., location module 216) may be used to plot the various sensors at a location on a map within a graphical user interface (GUI) via a visualization process 312. The GUI may allow for rich visual maps with detailed floor plans at various zoom levels, etc.

The visualization process 312 may be used (e.g., by operators) to gain awareness of any materials (e.g., radioactive material, etc.) or other conditions that travel through or occur in a monitored area. The visualization process 312 may display one or more alerts, which occur when a sensor reading satisfies a certain condition, e.g., exceeds a threshold, falls within a certain range, is below a certain threshold, etc., visually on a map. In some embodiments, an operator may be able to mark an alert, or series of alerts, as an "event." The visualization process 312 may have various tools to "replay" after an event has occurred. The visualization process 312 may further allow an operator to configure the visualization process 312 to send alerts to external entities. For example, the operator can configure an XML interface to forward alerts and events to a local Fusion Center (e.g., of the federal government). The operator may further configure an SMS gateway or even a Twitter account to send alerts or events to.

In some embodiments, the sensor manager process 310 and the visualization process 312 are configured for use of a user management process (not shown) (e.g., user management module 218) which may be an OpenID based user management system. When a user logs into the sensor management process 310 or the visualization process 312, his or her credentials may be checked against the user management process. The user management module can be used stand-alone, or integrated with existing user management systems (e.g., OpenLDAP, Microsoft Active Directory systems, etc.). The user management process may allow a single location to be used to maintain information associated with each user. The user management module may be configured to allow creation of additional administrators (e.g., by an existing administrator) or one or more operators that can access visualization process 312.

Figure 4:
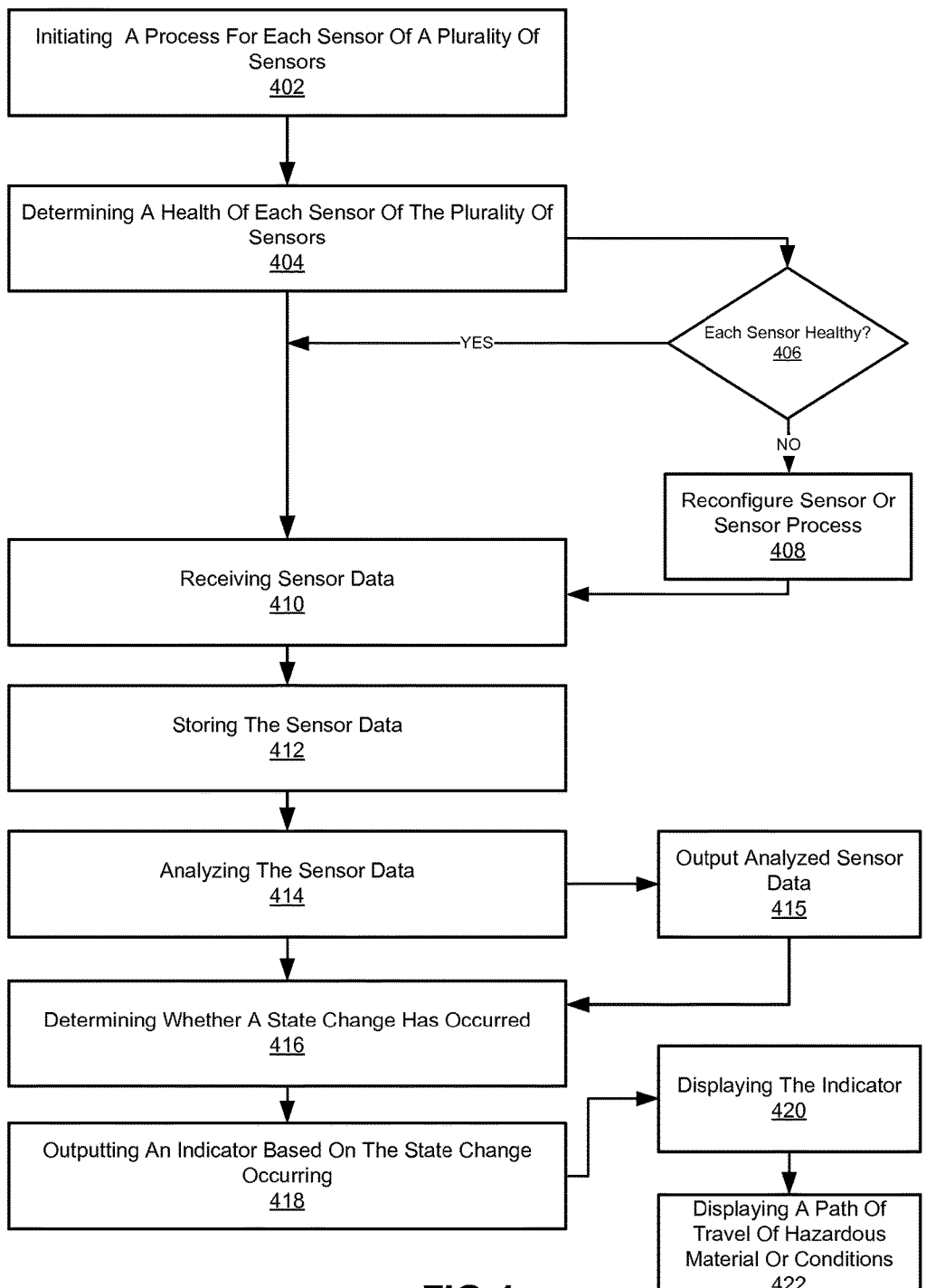
FIG. 4 shows an exemplary flow diagram of a process for monitoring and managing sensors via a plurality of executable processes in accordance with one embodiment.

FIG. 4 shows an exemplary flow diagram of a process 400 for monitoring and managing sensors (e.g., sensors 110-120) via a plurality of executable processes in accordance with one embodiment. In some embodiments, the process 400 may be performed by a sensor based detection module or component (e.g., sensor based detection system 102) or by multiple modules or components.

At block 402, a process for each sensor of a plurality of sensors may be initiated. As described herein, a sensor based detection system may initiate sensor processes to access or receive data from respective sensors. In some embodiments, the initiation of the process may be used to determine whether a sensor is functioning properly.

At block 404, the health of each sensor of the plurality of sensors may be determined. Sensor health may be determined based on whether a sensor is sending sensor readings (e.g., at regular or expected intervals in time), responding to communication signals (e.g., responding ping signals), sending sensor readings within a predetermined range, etc. Block 410 and/or block 406 may then be performed.

At block 406, the health of each sensor is analyzed. At step 408, unhealthy sensor processes may be reconfigured or the associated sensor process is reconfigured in order to make the unhealthy sensor processes operational. A sensor may be configured by sending the sensor a signal to restart (e.g., reboot or reinitialize). A sensor process may be terminated and restarted or sent a signal to restart. It is noteworthy that blocks 404-408 may be optional in some embodiments.

At block 410, sensor data is received. As described herein, sensor data from a plurality of sensors may be received by a sensor monitoring and management system (e.g., sensor based detection system 102).

At block 412, the sensor data is stored. In some embodiments, the sensor data is stored in a data warehouse or other data store (e.g., data warehouse module 208).

At block 414, the sensor data is analyzed. In some embodiments, the sensor data may be analyzed on a frame by frame basis and over an interval of time for a sensor reading value, as described herein.

At block 415, analyzed sensor data is output. In some embodiments, the sensor data may be output via a graphical user interface, as described above. In some embodiments, sensor readings (e.g., raw sensor data) may also be output (e.g., sent or displayed). Block 416 may then be optionally performed.

At block 416, whether a state change associated with a sensor reading value has occurred is determined. As described herein, a state change may be determined based on changes in a sensor reading over an interval of time (e.g., a change over a certain threshold over an interval of time).

At block 418, an indicator based on the state change that occurred is output. As described herein, the indicator may be one or more alerts from one or more sensors or an event based on alerts from multiple sensors. The events may be based on groups of sensors selected manually (e.g., via a GUI) or automatically (e.g., based on an automatic grouping determined by the sensor based detection system 102), or based on heuristics. In some embodiments, the indicator (e.g., alert, event, message, etc.) may be output to a messaging system (e.g., messaging system 108 or messaging module 214). For example, the indicator may be output to notify a person (e.g., operator, administrator, safety official, etc.) or group of persons (e.g., safety department, police department, fire department, homeland security, etc.).

In some embodiments, the indicator may be output on a graphical user interface, as described above. For example, the indicator may be output as part of a representation (e.g., an icon) of a sensor with the sensor depicted with a particular color based on the indicator. In some embodiments, the graphical user interface may also render information in response to a user manipulation. For example, in response to a user selection of a sensor, the sensor readings associated with the sensor may be displayed. In another example, a video feed associated with the sensor may also be displayed (e.g., simultaneously).

At block 420, the indicator is displayed. As described herein, the indicator may be displayed as part of a graphical user interface that further displays a visual sensor representation (e.g., icon) on a map with a color associated with the sensor reading and sensor reading levels, sensor location, sensor description, etc. It is appreciated that the indicator may include but is not limited to a green representation of a sensor depicting that the sensor reading is within a safe range, an orange representation of a sensor depicting that the sensor reading is slightly elevated and is outside of the safe range, a red representation of a sensor depicting that the sensor reading is highly elevated and considerably outside of the safe range, etc.

At block 422, a path of travel of hazardous material (e.g., radioactive material) or conditions (e.g., toxic gas cloud) is determined and displayed. The path of travel may be displayed on a map that graphically shows the sensors.

Figure 5:
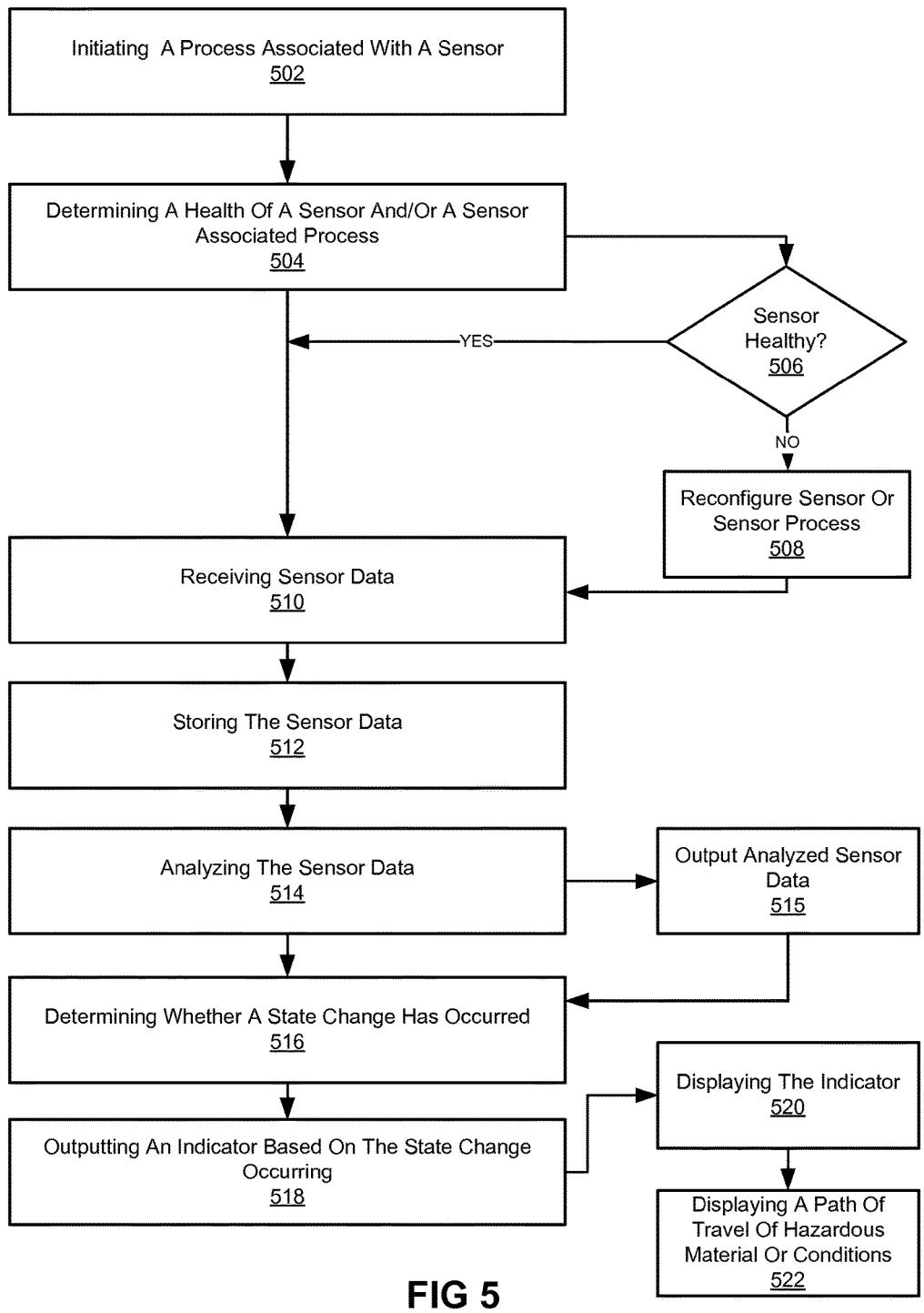
FIG. 5 shows an exemplary flow diagram of a process for monitoring and managing a sensor via an executable process in accordance with one embodiment.

FIG. 5 shows an exemplary flow diagram of a process for monitoring and managing a sensor via a sensor based process in accordance with one embodiment. In some embodiments, the process 500 may be performed by a sensor based detection module or component (e.g., sensor based detection system 102) or by multiple modules or components.

At block 502, a process associated with a sensor may be initiated. As described herein, a sensor based detection system may initiate a sensor process to access or receive data from an associated sensor. In some embodiments, one or more sensor processes may be associated with a sensor. In some embodiments, the initiation of the process may be used to determine whether a sensor is functioning properly.

At block 504, the health of the sensor and/or the health of the process associated with the sensor may be determined. Sensor health may be determined based on whether a sensor is sending sensor readings (e.g., at regular or expected intervals in time), responding to communication signals (e.g., responding to ping signals), sending sensor readings within a predetermined range, etc. Block 510 and/or block 506 may then be performed.

At block 506, the health of the sensor and/or the process associated with the sensor may be analyzed. At step 508, an unhealthy sensor may be reconfigured or the process associated with the sensor reconfigured in order to make the unhealthy sensor process operational. A sensor may be configured by sending the sensor a signal to restart (e.g., reboot or reinitialize). A sensor process may be terminated and restarted or sent a signal to restart. It is noteworthy that blocks 504-508 may be optional in some embodiments.

At block 510, sensor data is received. The sensor data may be received from the sensor or via a process associated with the sensor. As described herein, sensor data from a plurality of sensors may be received by a sensor monitoring and management system (e.g., sensor based detection system 102).

At block 512, the sensor data is stored. In some embodiments, the sensor data is stored in a data warehouse or other data store (e.g., data warehouse module 208).

At block 514, the sensor data is analyzed. In some embodiments, the sensor data may be analyzed on a frame by frame basis and over an interval of time for a sensor reading value, as described herein.

At block 515, analyzed sensor data is output. In some embodiments, the sensor data may be output via a graphical user interface, as described herein. In some embodiments, sensor readings (e.g., raw sensor data) may also be output (e.g., sent or displayed). Block 516 may then be optionally performed.

At block 516, whether a state change associated with a sensor reading value has occurred is determined. As described herein, a state change may be determined based on changes in a sensor reading over an interval of time (e.g., a change over a certain threshold over an interval of time).

At block 518, an indicator based on the state change that occurred is output. As described herein, the indicator may be one or more alerts from one or more sensors or an event based on alerts from multiple sensors. The events may be based on groups of sensors selected manually (e.g., via a GUI) or automatically (e.g., based on an automatic grouping determined by the sensor based detection system 102), or based on heuristics. In some embodiments, the indicator (e.g., alert, event, message, etc.) may be output to a messaging system (e.g., messaging system 108 or messaging module 214). For example, the indicator may be output to notify a person (e.g., operator, administrator, safety official, etc.) or group of persons (e.g., safety department, police department, fire department, homeland security, etc.).

In some embodiments, the indicator may be output on a graphical user interface, as described above. For example, the indicator may be output as part of a representation (e.g., an icon) of a sensor with the sensor depicted with a particular color based on the indicator. In some embodiments, the graphical user interface may also render information in response to a user manipulation. For example, in response to a user selection of a sensor, the sensor readings associated with the sensor may be displayed. In another example, a video feed associated with the sensor may also be displayed (e.g., simultaneously).

At block 520, the indicator is displayed. As described herein, the indicator may be displayed as part of a graphical user interface that further displays a visual sensor representation (e.g., an icon) on a map with a color associated with the sensor reading and sensor reading levels, sensor location, sensor description, etc. It is appreciated that the indicator may include but is not limited to a green representation of a sensor depicting that the sensor reading is within a safe range, an orange representation of a sensor depicting that the sensor reading is slightly elevated and is outside of the safe range, a red representation of a sensor depicting that the sensor reading is highly elevated and considerably outside of the safe range, etc.

At block 522, a path of travel of hazardous material (e.g., radioactive material) or conditions (e.g., toxic gas cloud) is determined and displayed. The path of travel may be displayed on a map that graphically shows the sensors.

Figure 6:
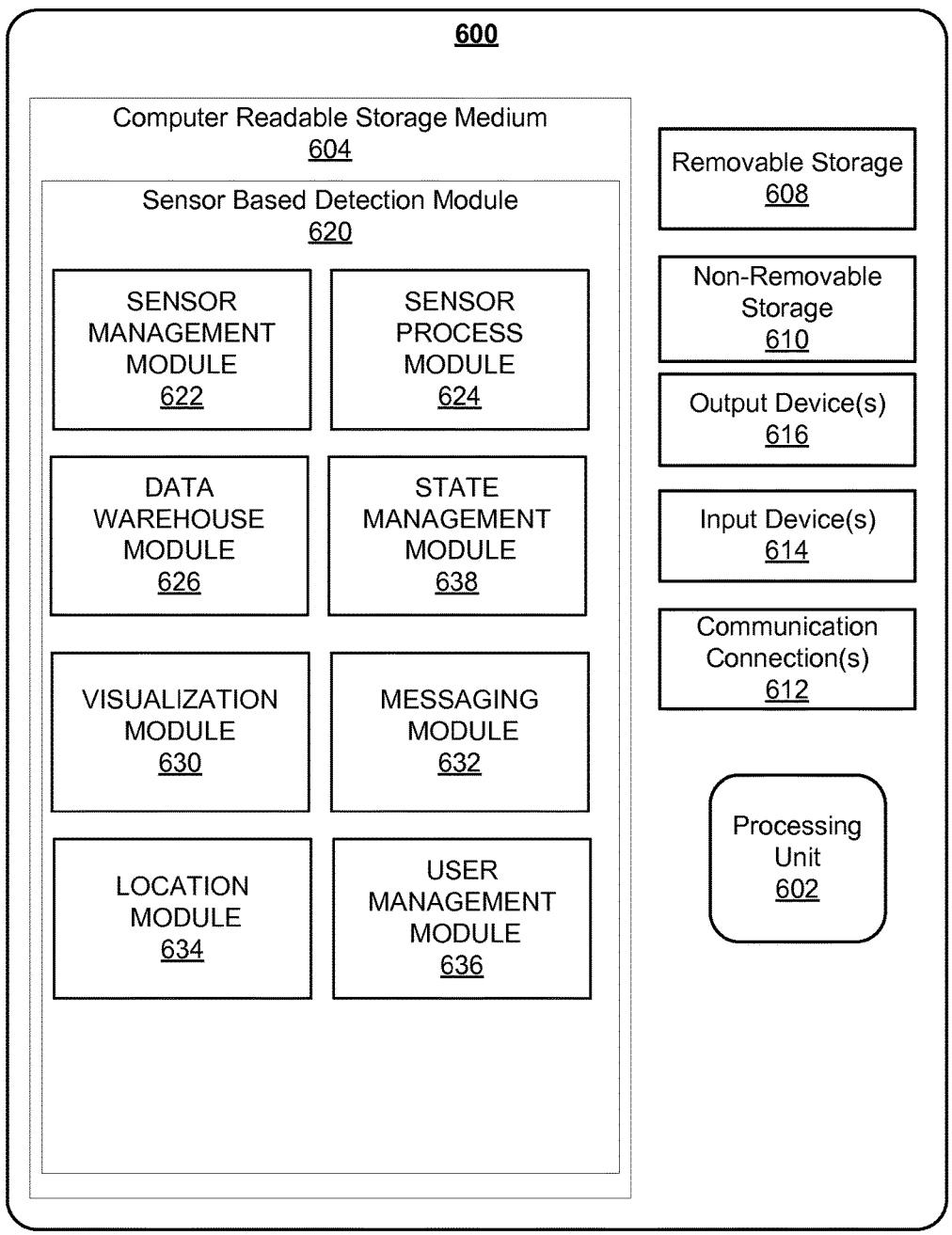
FIG. 6 shows a block diagram of an exemplary computer system in accordance with one embodiment.

Referring now to FIG. 6, a block diagram of an exemplary computer system in accordance with one embodiment is shown. With reference to FIG. 6, an exemplary system module for implementing embodiments disclosed herein, such as the embodiments described in FIGS. 1-5. In some embodiments, the system includes a general purpose computing system environment, such as computing system environment 600. Computing system environment 600 may include, but is not limited to, servers, desktop computers, laptops, tablets, mobile devices, and smartphones. In its most basic configuration, computing system environment 600 typically includes at least one processing unit 602 and at least one computer readable storage medium 604. Depending on the exact configuration and type of computing system environment, the computer readable storage medium 604 may be volatile (such as RAM), non-volatile (such as ROM, flash memory, etc.) or some combination of the two. Portions of the computer readable storage medium 604 when executed facilitate monitoring and managing sensors according to embodiments described herein (e.g., processes 400-500).

Additionally in various embodiments, the computing system environment 600 may also have other features/functionality. For example, the computing system environment 600 may also include additional storage (removable and/or non-removable) including, but not limited to, magnetic or optical disks or tape. Such additional storage is illustrated by removable storage 608 and non-removable storage 610. Computer storage media includes volatile and nonvolatile, removable and non-removable media implemented in any method or technology for storage of information such as computer readable instructions, data structures, program modules or other data. Computer readable medium 604, removable storage 608 and nonremovable storage 610 are all examples of computer storage media. Computer storage media includes, but is not limited to, RAM, ROM, EEPROM, flash memory or other memory technology, expandable memory (e.g. USB sticks, compact flash cards, SD cards), CD-ROM, digital versatile disks (DVD) or other optical storage, magnetic cassettes, magnetic tape, magnetic disk storage or other magnetic storage devices, or any other medium which can be used to store the desired information and which can be accessed by computing system environment 600. Any such computer storage media may be part of computing system environment 600.

In some embodiments, the computing system environment 600 may also contain communications connection(s) 612 that allow it to communicate with other devices. Communications connection(s) 612 is an example of communication media. The communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. The term computer readable media as used herein includes both storage media and communication media.

The communications connection(s) 612 may allow the computing system environment 600 to communicate over various networks types including, but not limited to, fibre channel, small computer system interface (SCSI), Bluetooth, Ethernet, Wi-Fi, Infrared Data Association (IrDA), Local area networks (LAN), Wireless Local area networks (WLAN), wide area networks (WAN) such as the internet, serial, and universal serial bus (USB). It is appreciated the various network types that the communication connection(s) 612 connect to may run a plurality of network protocols including, but not limited to, transmission control protocol (TCP), user datagram protocol (UDP), internet protocol (IP), real-time transport protocol (RTP), real-time transport control protocol (RTCP), file transfer protocol (FTP), and hypertext transfer protocol (HTTP).

In further embodiments, the computing system environment 600 may also have input device(s) 614 such as keyboard, mouse, a terminal or terminal emulator (either directly connected or remotely accessible via telnet, SSH, HTTP, SSL, etc.), pen, voice input device, touch input device, remote control, etc. Output device(s) 616 such as a display, a terminal or terminal emulator (either directly connected or remotely accessible via telnet, SSH, HTTP, SSL, etc.), speakers, LEDs, etc. may also be included.

In one embodiment, the computer readable storage medium 604 includes a sensor based detection module 620. The sensor based detection module 620 includes, a sensor management module 622, a sensor process module 624, a data warehouse module 626, a state management module 628, a visualization module 630, a messaging module 632, a location module 634, and a user management module 636.

The sensor management module 622 is configured for managing and monitoring the sensors and associated respective instances of the sensor process module 624, as described herein. The sensor management module 622 may be configured to launch multiple sensor processes based on sensor process module 624. The sensor process module 624 may be configured to receive sensor data or access data from a variety of sensors, as described herein. The data warehouse module 626 may be used to store sensor data, analyzed sensor data, and optional sensor and sensor process health information, as described above. In some embodiments, the data warehouse 626 may determine whether a state change has occurred based on sensor based data. The state management module 628 is configured to determine whether the state of a sensor has changed based on previously collected or determined sensor based data, as described herein. The visualization module 630 is configured to visually display sensor data and information based on the sensor data, as described herein. In some embodiments, the visualization module 630 is configured to display information associated with the sensor data in a geographical context (e.g., on a map).

The messaging module 632 is configured to prepare and package (e.g., formatting) sensor based information for the sending to various messaging systems, as described herein. The location module 634 is configured to collect, store (e.g., locally or within a data warehouse), and utilize sensor location information to facilitate grouping of sensors (e.g., manual or automatic grouping) and to determine the travel path of hazardous materials or conditions within range of sensors, as described herein. The user management module 636 is configured to allow system-wide user access based on integration with other user systems, as described herein.

Figure 7:
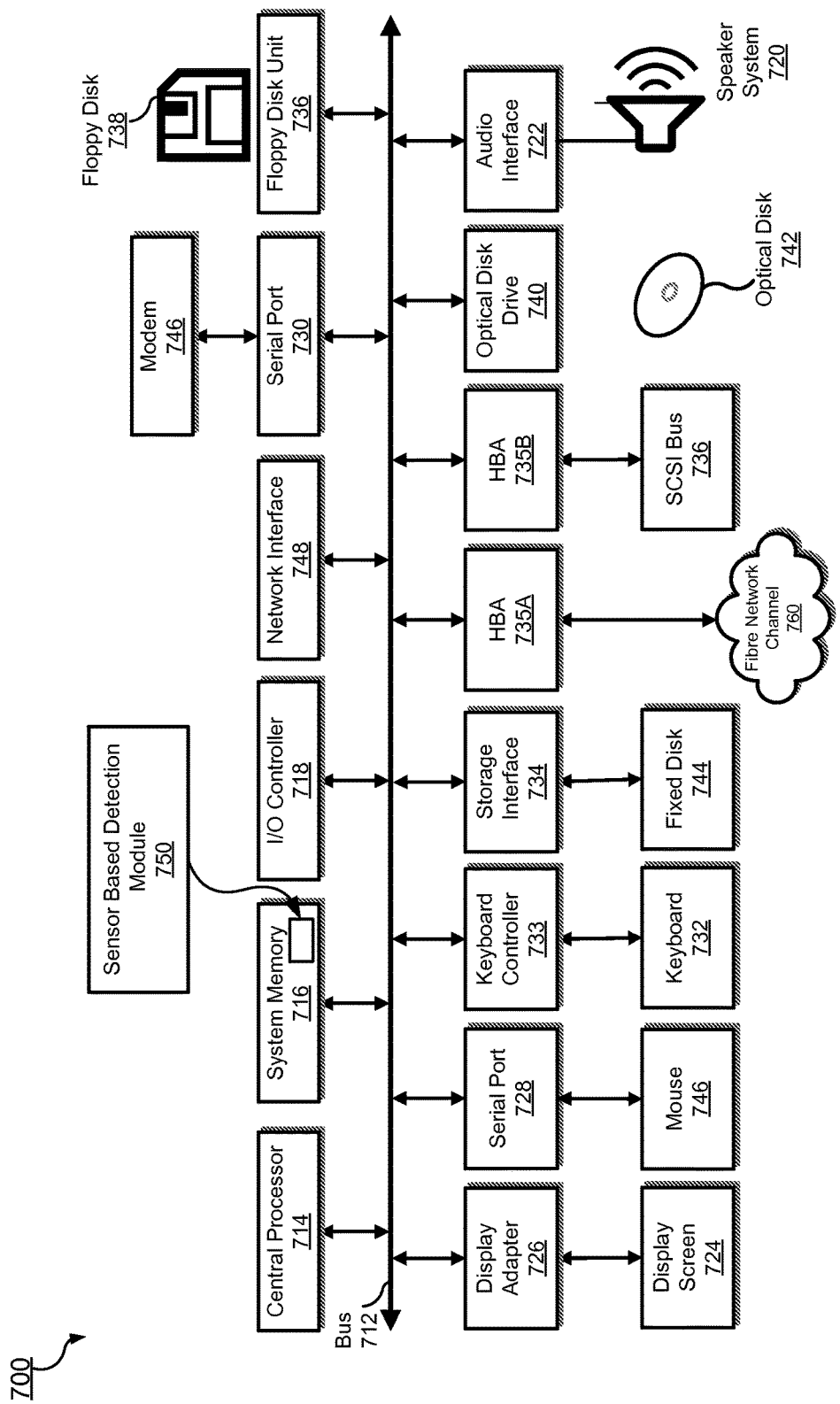
FIG. 7 shows a block diagram of another exemplary computer system in accordance with one embodiment.

Referring now to FIG. 7, a block diagram of another exemplary computer system in accordance with one embodiment is shown. FIG. 7 depicts a block diagram of a computer system 700 suitable for implementing the present disclosure. The computer system 700 includes a bus 712 which interconnects major subsystems of the computer system 700, such as a central processor 714, a system memory 716 (typically RAM, but which may also include ROM, flash RAM, or the like), an input/output controller 718, an external audio device, such as a speaker system 720 via an audio output interface 722, an external device, such as a display screen 724 via display adapter 726, serial ports 728 and 730, a keyboard 732 (interfaced with a keyboard controller 733), a storage interface 734, a floppy disk drive 736 operative to receive a floppy disk 738, a host bus adapter (HBA) interface card 735A operative to connect with a Fibre Channel network 760, a host bus adapter (HBA) interface card 735B operative to connect to a Small Computer System Interface (SCSI) bus 736, and an optical disk drive 740 operative to receive an optical disk 742. Also included are a mouse 746 (or other point-and-click device, coupled to bus 712 via serial port 728), a modem 746 (coupled to bus 712 via serial port 730), and a network interface 748 (coupled directly to bus 712).

It is appreciated that the network interface 748 may include one or more Ethernet ports, wireless local area network (WLAN) interfaces, etc., but is not limited thereto. The system memory 716 includes a sensor based detection module 750, which is configured to monitor and manage a plurality of sensors. According to one embodiment, the sensor based detection module 750 may include other modules for carrying out various tasks (e.g., modules of FIG. 6). It is appreciated that sensor based detection module 750 may be located anywhere in the system and is not limited to the system memory 716. As such, residing within the system memory 716 is merely exemplary and not intended to limit the scope of the embodiments. For example, parts of the sensor based detection module 750 may be located within the central processor 714 and/or the network interface 748 but are not limited thereto.

The bus 712 allows data communication between the central processor 714 and the system memory 716, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS), which controls basic hardware operation such as the interaction with peripheral components. Applications resident with the computer system 700 are generally stored on and accessed via a computer readable medium, such as a hard disk drive (e.g., fixed disk 744), an optical drive (e.g., optical drive 740), a floppy disk unit 736, or other storage medium. Additionally, applications can be in the form of electronic signals modulated in accordance with the application and data communication technology when accessed via modem 746 or network interface 748.

The storage interface 734, as with the other storage interfaces of the computer system 700, can connect to a standard computer readable medium for storage and/or retrieval of information, such as a fixed disk drive 744. The fixed disk drive 744 may be a part of a computer system 700 or may be separate and accessed through other interface systems. The network interface 748 may provide multiple connections to the networked devices. Furthermore, the modem 746 may provide a direct connection to a remote server via a telephone link or to the Internet via an Internet service provider (ISP). The network interface 748 provides one or more connections to a data network, which may consist of any number of other network-connected devices. The network interface 748 may provide such a connection using wireless techniques, including digital cellular telephone connection, Cellular Digital Packet Data (CDPD) connection, digital satellite data connection or the like.

Many other devices or subsystems (not shown) may be connected in a similar manner (e.g., document scanners, digital cameras and so on). Conversely, not all of the devices shown in FIG. 7 need to be present to practice the present disclosure. The devices and subsystems can be interconnected in different ways from that shown in FIG. 7. Code to implement the present disclosure can be stored in computer-readable storage media such as one or more of system memory 716, fixed disk 744, optical disk 742, or floppy disk 738. The operating system provided on the computer system 700 may be MS-DOS®, MS-WINDOWS®, OS/2®, UNIX®, Linux®, or any other operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present disclosure may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing description, for purpose of explanation, has been described with reference to specific embodiments. However, the illustrative discussions above are not intended to be exhaustive or to limit the embodiments to the precise forms disclosed. Many modifications and variations are possible in view of the above teachings.

What is claimed is:

1. A method comprising:
   initiating a process for a sensor, wherein the process accesses a data stream for the sensor;
   determining a health of the sensor, wherein the sensor health is based on whether the sensor is sending the data stream;
   reconfiguring the sensor if the health of the sensor is determined to be unhealthy, wherein reconfiguring the sensor comprises sending a signal to restart the sensor;
   receiving the data stream at an interval, wherein the data stream is associated with the sensor;
   storing the received data stream associated with the sensor;
   determining whether the stored data stream at the interval satisfies a certain criteria to trigger an alert, and wherein the certain criteria is a change in a state of the sensor;
   in response to determining that the data stream satisfies the certain criteria, sending the alert; and
   displaying information associated with the data stream of the sensor on a graphical user interface.

2. The method as described in claim 1, wherein the certain criteria is whether the data stream at the interval exceeds a threshold, wherein the threshold is at least one of: a historical value and a user selected value.

3. The method as described in claim 1, wherein the alert is a message transmitted to indicate that a hazardous material is detected by the sensor, wherein the message is at least one of: an email to a user, an audible alarm, a tweet alert, an alert to a police department, and an alert to a homeland security department.

4. The method as described in claim 1, wherein the sensor comprises a complementary metal-oxide-semiconductor (CMOS) component operable for detecting gamma radiation, and wherein the certain criteria is a calculated rate of microSieverts (mSv) per hour.

5. The method as described in claim 1 further comprising:
   rendering a map comprising one or more floor plans, wherein the sensor is shown on the map based on a location of the sensor, wherein the location is based on a stored location information and global positioning system (GPS) coordinates for the sensor.

6. The method as described in claim 1, wherein the determining is further based on other sensors within a selected proximity of the sensor.

7. The method as described in claim 1 further comprising:
   storing the data stream at the interval.

8. The method as described in claim 1 further comprising:
   responsive to a selection of the sensor via a graphical user interface, rendering the data stream at the interval on the graphical user interface.

9. A system comprising:
   a process module configured to analyze a current sensor data from an associated sensor of a plurality of sensors;
   a sensor management module configured to manage a plurality of instances of the process module, wherein the sensor management module is further configured to associate metadata of the associated sensor with the current sensor data, wherein the sensor management module is further configured to determine a health of an associated sensor of the plurality of sensors, wherein the health of the associated sensor is determined based on whether a predicted value is received from the associated sensor within a certain time period and whether data is arriving from the associated sensor on time; and
   a state management module configured to determine whether a state change of the associated sensor has occurred, wherein the determination is based on a comparison between the current sensor data and a previous sensor data.

10. The system of claim 9 further comprising:
    a data store module configured to receive the metadata and the current sensor data, wherein the data store module is further configured to store the metadata and the current sensor data, and wherein the metadata includes geographical information on the associated sensor and a description of the associated sensor.

11. The system of claim 10, wherein the data store module comprises the state determination module.

12. The system of claim 9 further comprising:
    a visualization module configured to display the current sensor data and a representation of the associated sensor based on the metadata, wherein the visualization module further comprises a tree filter to view each of the plurality of sensors in a hierarchical context and a map view to view each of the plurality of sensors in a geographical context.

13. The system of claim 12, wherein the visualization module is configured to display the current sensor data, wherein the current sensor data is visually positioned in close proximity to geographical location of the associated sensor on a map.

14. The system of claim 9 further comprising:
    a messaging module configured to send a message based on the current sensor data, the metadata, and further based on whether the current sensor data satisfies a certain condition, and wherein the message is a national information exchange model (NIEM) compliant message used to report at least one of: a chemical, a biological, a radiological, and a nuclear defense (CBRN) suspicious activity report (SAR) to at least one government entity.

15. The system of claim 9, wherein the sensor management module is configured to determine a health of each instance of the process module of the plurality of instances of the process module, and wherein the sensor management module is further configured to receive an indicator of a status from the associated sensor, wherein the indicator of status is at least one of: an alive signal, an error signal, an on signal, and an off signal.

16. A system comprising:
    a plurality of radiation sensors; and
    a sensor based detection system coupled to the plurality of radiation sensors, wherein the sensor detection system is configured to monitor, manage, and analyze data from the plurality of radiation sensors, wherein the sensor based detection system is further configured to initiate a process for the plurality of radiation sensors, wherein the process accesses a data stream for the sensor, wherein the sensor based detection system is further configured to determine a health of the plurality of radiation sensors, wherein the sensor health is based on whether the sensor is sending the data stream, and wherein the sensor based detection system is further configured to reconfigure the plurality of radiation sensors if the health of the plurality of radiation sensors is determined to be unhealthy, wherein reconfiguring the sensor comprises sending a signal to restart the plurality of radiation sensors.

17. The system of claim 16, wherein at least one sensor of the plurality of radiation sensors comprises a complementary metal-oxide-semiconductor (CMOS) component, and wherein the sensor provides a calculated rate of microSieverts (mSv) per hour.

18. The system of claim 16, wherein the sensor based detection system is configured to determine a health of a respective analytics process associated with a respective radiation sensor of the plurality of radiation sensors.

19. The system of claim 16, wherein the sensor based detection system is configured to display sensor data and metadata of a radiation sensor of the plurality of radiation sensors, wherein the sensor based detection system is further configured to display a tree filter to view each of the plurality of radiation sensors in a hierarchical context and a map view to view each of the plurality of radiation sensors in a geographical context.

20. The system of claim 19, wherein the sensor based detection system is configured to store the sensor data and the metadata, and wherein the metadata includes geographical information on the associated sensor and a description of the associated sensor.

21. The system of claim 19, wherein the sensor based detection system is configured to send a message based on the sensor data and the metadata, and wherein the message is a national information exchange model (NIEM) compliant message used to report at least one of: a chemical, a biological, a radiological, and a nuclear defense (CBRN) suspicious activity report (SAR) to at least one government entity.

22. The system of claim 19, wherein the sensor based detection system is configured to determine a sensor state change based on a previous sensor reading, and wherein the sensor is at one of five states: calibration, nominal, elevated, potential, and alert.

* * * * *